United States Patent [19]
Harris et al.

[11] Patent Number: 5,847,414
[45] Date of Patent: Dec. 8, 1998

[54] SEMICONDUCTOR DEVICE HAVING A HETERO-JUNCTION BETWEEN SIC AND A GROUP 3B-NITRIDE

[75] Inventors: Christopher Harris, Sollentuna; Andrey Konstantinov, Linköping; Erik Janzén, Borensberg, all of Switzerland

[73] Assignee: ABB Research Limited, Zürich, Switzerland

[21] Appl. No.: 912,357

[22] Filed: Aug. 18, 1997

Related U.S. Application Data

[63] Continuation of Ser. No. 550,401, Oct. 30, 1995, abandoned.

[51] Int. Cl.$^6$ ............................................. H01L 31/0312
[52] U.S. Cl. ........................... 257/77; 257/183; 257/200
[58] Field of Search ............................... 257/77, 183, 200, 257/76

[56] References Cited

U.S. PATENT DOCUMENTS

| | | | |
|---|---|---|---|
| 4,929,985 | 5/1990 | Takasaki | 357/15 |
| 5,184,199 | 2/1993 | Fujii et al. | 257/77 |
| 5,247,533 | 9/1993 | Okazaki et al. | 257/13 |
| 5,273,933 | 12/1993 | Hatano et al. | 437/127 |
| 5,296,395 | 3/1994 | Khan et al. | 437/40 |
| 5,326,992 | 7/1994 | Yoder | 257/77 |
| 5,387,804 | 2/1995 | Suzuki et al. | 257/77 |
| 5,393,990 | 2/1995 | Kohn | 257/12 |
| 5,536,952 | 7/1996 | Shikata | 257/77 |

FOREIGN PATENT DOCUMENTS

| | | |
|---|---|---|
| 2 707 425 | 1/1995 | France . |
| 4-267376 | 9/1992 | Japan .......................... 257/77 |
| WO 96/09653 | 3/1996 | WIPO . |

OTHER PUBLICATIONS

Ali et al., HEMTs and HBTs: Devices, Fabrication, and Circuits, Artech House, 1991 Chapters 1 and 2, pp. 1–25.
Ashburn et al., Heterojunction Bipolar Transistors, Chapter 6, p. 200, 1991.
Khan et al., High Electron Mobility Transistor Based On A GaN–Al$_x$Ga$_{1-x}$N Heterojunction, Appl. Phys. Lett. 63 (9), 30 Aug. 1993, pp. 1214–1215.
Yu et al., Control of the Solid AlN/SiC Composition by the Growth of Multi–Layered Structures, Inst. Phys, Conf. Ser. No. 137: Chapter 4, pp. 393–395 (Date unknown).
Kern et al., Growth of Pseudomorphic Heterostructures and Solid Solutions in the AlN–SiC System by Plasma–Assisted, Gas–Source Molecular Beam Epitaxy, Inst. Phys, Conf. Ser. No. 137: Chapter 4, pp. 389–392 (Date unknown).
Tasker et al., High Electron Mobility Transistors, Chapter 5, pp. 147–199, Fraunhofer–Institut, Freiburg, Germany (Date unknown).

*Primary Examiner*—Olik Chaudhuri
*Assistant Examiner*—Nat Kelley
*Attorney, Agent, or Firm*—Pollock, Vande Sande & Amernick

[57] ABSTRACT

A semiconductor device comprises two adjacent semiconductor layers of different materials forming a heterojunction therebetween. A first layer has a larger gap between the conduction band and the valence band that a second layer at the interface between the layers. The second layer is made of SiC and the first layer is made of one of at least a) AlN and b) an alloy of AlN and other Group 3B-nitride.

15 Claims, 2 Drawing Sheets

SEMICONDUCTOR DEVICE HAVING A HETERO-JUNCTION BETWEEN SIC AND A GROUP 3B-NITRIDE

This application is a continuation of U.S. patent application Ser. No. 08/550,401, filed Oct. 30, 1995, now abandoned.

FIELD OF THE INVENTION

The present invention relates to a semiconductor device comprising two adjacent semiconductor layers of different material forming a heterojunction therebetween. The first of the layers has a larger band gap between the conduction band and valence band than the second layer, and is doped with impurities providing charge for forming a high mobility surface channel in the second layer at the interface between the layers. This type of semiconductor device is called a HEMT (High Electron Mobility Transistor) due to the high mobility of charge carriers in the surface channel, resulting from the fact that the free charge carriers in the channel are physically separated from the ionized impurities in the first layer reducing scattering of the charge carriers. These semiconductor devices are gate controlled.

BACKGROUND OF THE INVENTION

The advantage thereof with respect to gate-controlled Field Effect Transistors having an insulating layer, normally $SiO_2$, between the gate and the semiconductor layer is that the amorphous nature of such an insulating layer as $SiO_2$ results in additional scattering of carriers in the inversion channel at the interface, particularly in the case of high carrier densities where strong carrier localization occurs at the semiconductor-insulating layer interface, so that the mobility of carriers will be considerably below the bulk carrier mobility. In contrast, a high quality heterojunction is known to be nearly free from interface scattering and carrier confinement which can also bring about a rise in carrier mobilities since the impurities are spatially separated from the mobile carriers, which is called modulation doping. Because of the high mobility, HEMTs may operate under high frequencies. However, known devices of this type, which may have a heterojunction of, for example, GaAs/AlGaAs, may not be obtained with such high carrier densities that they could be used in high power devices, and the material will also be unable to take the heat created when high currents are transported.

It is therefor desired to be able to use SiC as the second layer in such semiconductor devices, since it would then be possible to benefit from the superior properties thereof in comparison with other semiconductors, especially Si, namely the capability of SiC to function well under extreme conditions. SiC has a high thermal stability and will have a stable function at much higher temperatures than, for instance Si, namely well up to 1000° K. Furthermore, it has a high thermal conductivity, so that SiC devices may be arranged at a high density, and may accordingly also carry high currents.

However, no High Electron Mobility Transistor having SiC as the second layer has been suggested until now. Thus, the use of SiC in Field Effect Transistors has been restricted to gate-controlled semiconductor devices having an insulated gate with the disadvantages mentioned above of poor channel mobility in the inversion channel in SiC.

SUMMARY OF THE INVENTION

The object of the present invention is to provide a semiconductor device of the type defined in the introduction, which has a high quality heterojunction and may operate under high frequencies and carry high currents while maintaining a good function stability.

This object is in accordance with the invention obtained by making the second layer of SiC and the first layer of one of a) AlN and b) an alloy of AlN and other Group 3B-nitrides. AlN has a very good lattice match with SiC with a misfit of only 0,7%, so that very high quality heterojunctions between SiC and AlN, nearly free from interface scattering, may be grown. It also has nearly the same coefficient of thermal expansion as SiC and is stable at very high temperatures. Furthermore, AlN has a band gap of about 6,2 eV, which is considerably larger than all polytypes of SiC, which have band gaps between 2,3 and 3,3 eV. This results in a considerably larger energy band offset (energy difference between the bands) of a system of SiC/AlN than in heterojunctions in prior art semiconductor devices.

For the sake of clarity, we will hereinafter refer to electrons as charge carriers in the surface channel, since it is much more interesting to use electrons than holes as charge carriers in this type of devices because of the much lower mobility of holes, and the impurities are therefore donors. However it is emphasized that the invention is not in any way restricted to electrons as charge carriers in the surface channel. This larger band offset means that more electrons may be put in the interface channel from the ionized donors before the conduction band in the first layer has been bent to the Fermi-level. Accordingly, it is possible to obtain far higher carrier densities and currents than in prior art HEMTs.

Because of the characteristics of the materials forming the two layers in a semiconductor device according to the invention such a device may be operated at high frequencies and carry high currents thus may function well as high-power devices. The first layer may also be made of an alloy of AlN and other Group 3B-nitrides, through which a high quality heterojunction may also be obtained. The presence of such Group 3B-nitrides may make it easier to obtain a well-defined doping of the first layer, but these other Group 3B-nitrides have smaller gaps between the valence band and the conduction band, so that they counteract the advantages of the large band-offset of AlN with respect to SiC, so that it will mostly be suitable to have a high concentration of AlN and a lower concentration of one or more of the other Group 3B-nitride in any case close to the heterojunction.

According to a preferred embodiment of the invention, a first region of the first layer closest to the junction is made of AlN. This means that the lattice match at the heterojunction, and the quality of the heterojunction, will be at an optimum, so that the mobility in the two dimensional interface channel will be very high.

According to another preferred embodiment of the invention, a second region of the first layer adjacent to the first region of AlN and separated from the junction therethrough is made of an alloy of AlN and other Group 3B-nitrides. This means that the high quality heterojunction is ensured by the first region of AlN at the heterojunction and, at the same time, it is easier to dope the first layer by the presence of the second region of an alloy of AlN and other Group 3B-nitrides.

According to a further embodiment of the invention, the region of the first layer closest to the junction is not doped with impurities so that a spacer layer is obtained and the ionized donors are well separated from the surface channel and consequently do not affect the mobility of the electrons therein, so that this mobility will be excellent. This embodiment, in combination with the embodiment last mentioned, is very advantageous.

According to a further preferred embodiment of the invention, the concentration of the Group 3B-nitrides in the alloy gradually increases in the at least one region in a direction away from the junction. By providing such a graded layer, there will be no abrupt change in the composition of the layer material which would lead to strains in the material influencing the mobility in the surface channel. As a result such strains are reduced and the mobility in the surface channel is higher.

In the case of the first region of AlN, and the second region of an alloy of AlN and other Group 3B-nitrides, this results in there being no abrupt change from AlN to the alloy. Thus, when growing the first layer, the concentration of, for example, gallium, may be gradually increased in the direction away from the heterojunction.

According to a further preferred embodiment of the invention, the alloy is an alloy having a content of GaN which is very advantageous, since gallium nitride and aluminium nitride have a complete miscibility so that a high quality layer may be obtained.

According to another embodiment of the invention, the second layer is made of 3C-SiC. The use of this particular polytype of SiC is advantageous in this type of device, in which the mobility is of most importance, since this polytype is characterised by a particularly high mobility.

Further advantages and preferred features of the invention will appear from the following description and the other dependent claims.

BRIEF DESCRIPTION OF THE DRAWINGS

The appended drawings disclose preferred embodiments of the invention as examples. In the drawings.

DETAILED DESCRIPTION OF PREFERRED EMBODIMENTS OF THE INVENTION

Figure 1:
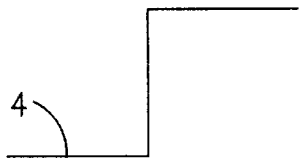
FIG. 1 illustrates the difference in band gap of two layers at a heterojunction in a semiconductor device having AlN or an alloy of AlN and other Group 3B-nitrides as one layer, and SiC as the other layer for illustrating how a surface channel having charge carriers is obtained by auto-ionization of impurities in the layer with the largest band gap, FIG. 2 discloses the extension of the valence and conduction bands close to the heterojunction, illustrating the high mobility surface channel at the interface between the two layers and how the ionized donors influence the mobility therein.

FIG. 1 illustrates a heterojunction 1 between a first layer 2 and a second layer 3 in a semiconductor device. It is very schematically illustrated that the energy gap between the valence band 4 and the conduction band 5 is larger in the first layer 2 than in the second layer 3, so that a band-offset is obtained at the heterojunction.

When the first layer is doped with donors, these have their free electrons 6 at a higher energy level than the energy level at the other side of the heterojunction. This result in a fall of said electrons as indicated by the arrow to the lower energy level in the second layer while ionizing the donors and leaving positive holes in the first layer 2. This technique of providing only the layer with the largest band gap with impurities is called selective doping or modulation doping. In this way an electrical field is created at the heterojunction bending the conduction bands in the way shown in FIG. 2.

Figure 2:
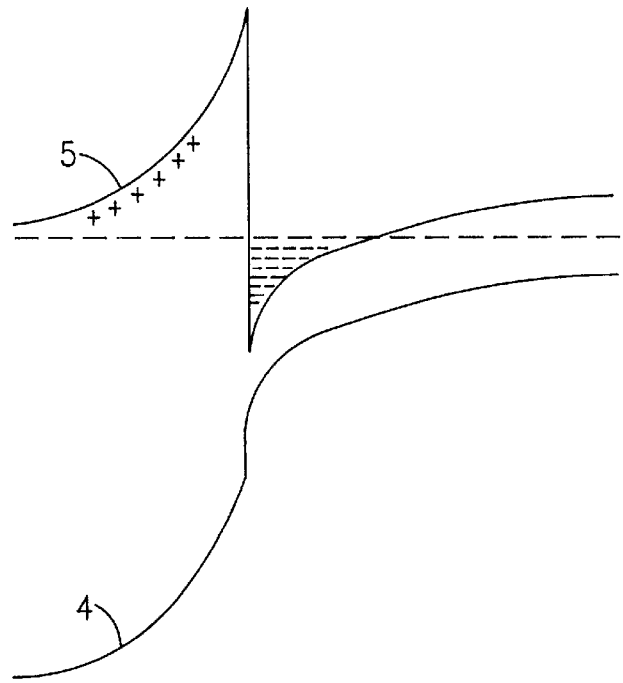

The higher the concentration of donors in the first layer comparatively close to the heterojunction, the more electrons will "fall" to the lower energy level in the second layer 3 and the more will the conduction band be bent. The maximum limit of electrons in the two-dimensional surface channel 7 so formed by the ionization of the donors depends on the band offset between the conduction bands in the two layers, and it is only possible to put in electrons in the surface channel until the Fermi-level in both layers has reached equilibrium as shown in FIG. 2.

In the case of the second layer of SiC and the first layer of AlN, the barrier height 8 will be about 1,7 eV in comparison to a heterojunction between GaAs and AlGaAs, which has a barrier height of 300 meV. Because of this increased barrier height, it is possible to raise the maximum density of free electrons in the two dimensional surface channel from about $10^{12}$ cm$^{-2}$ to above $10^{13}$ cm$^{-2}$. The sharpness of the conduction band shown in FIG. 2 is defined by the concentration of the impurity, i. e. the doping, of the first layer 2. This higher electron density results in the possibility to carry much higher currents, so that such a semiconductor device may handle more power, which turn results in more heat, which SiC as well as AlN are designed to accommodate while maintaining stable functioning of the device. The higher band-offset also results in a tighter confinement of the electrons in the potential.

Figure 3:
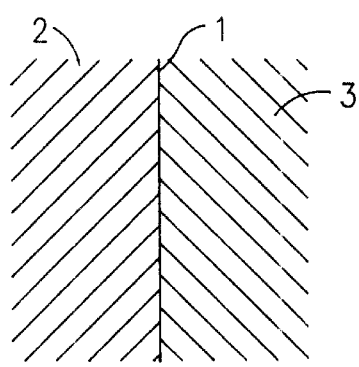
FIG. 3 illustrates the concentration of AlN in the first layer in relation to the distance from the heterojunction in the semiconductor device having the conduction band extension shown in FIG. 2.
Figure 3:
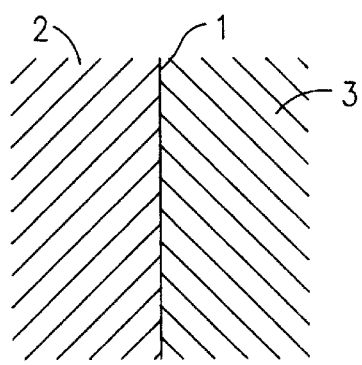
Figure 3:
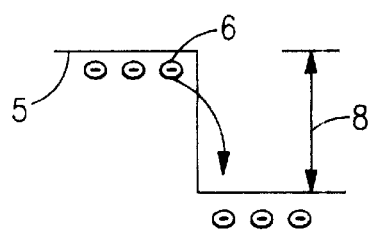
Figure 3:
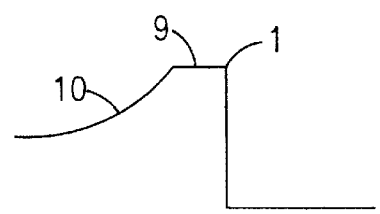

FIG. 3 shows how the concentration of AlN in the first layer is changed in the direction away from the heterojunction 1. In a first region 9 of the first layer closest to the junction the material consists of only AlN. Consequently, the highest quality possible of the heterojunction may be obtained because of the excellent lattice match and match of physical properties of AlN and SiC.

At a distance from the heterojunction 1, another Group 3B-nitride is mixed with AlN to an alloy in which the concentration of the Group 3B-nitride gradually increases in this second region 10 away from the junction. This other Group 3B-nitride may be GaN or InN. In the latter case the concentration thereof may not be larger than 20% since, after that, there will be hardly no band gap between the first layer and the second layer. The intermixing of gallium or indium may have two purposes, namely the content thereof may be used to vary the band-offset and they will make it easier to obtain a doping of the first layer. Preferably, the region of the first region closest to the junction is not doped with impurities so that the attraction of the ionized donors in the first layer exerted upon the electrons in the surface channel will be reduced resulting in a mobility increase. FIG. 2, shows how the region closest to the heterojunction is not doped with any impurities. It is not absolutely necessary that the first region made of AlN corresponds to the region having no doping, but the former may be thicker or thinner.

The gradual increase of the concentration of the other Group 3B-nitride in the first layer in the direction away from the heterojunction which occurs when the crystal is grown reduces strains in the material as compared to an abrupt change in alloy composition which also has a positive influence on the mobility in the surface channel.

In this way, a Field Effect Transistor (FET) which may be used as an amplifier with a gate voltage regulating the current in the two dimensional channel may be obtained. This device will be nearly free from interface scattering at the interface so that electrons may be moved very fast and the device may operate at high frequencies. Because of the possibility of carrying very high currents, the device will be well suited for use in high power applications.

Figure 4:
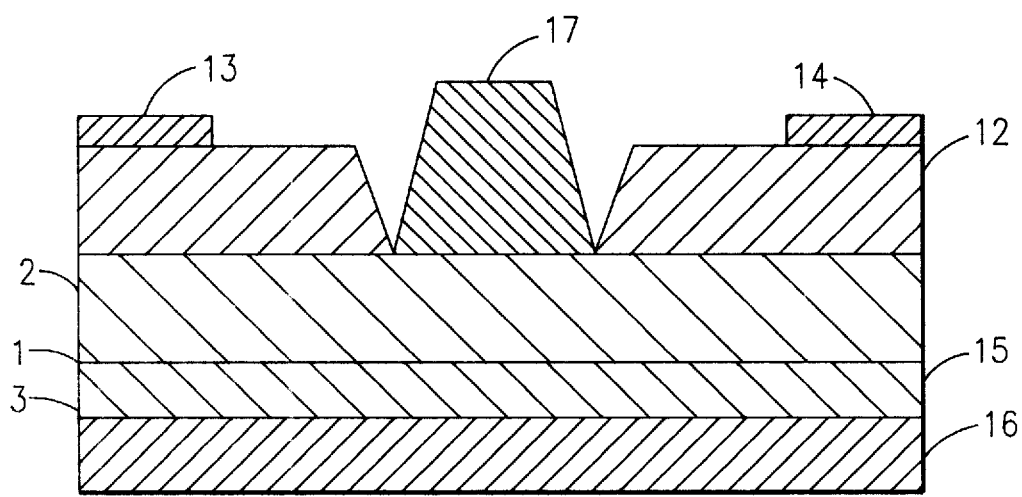
FIG. 4 illustrates a High Electron Mobility Transistor (HEMT), which may be provided with the layers made of the material according to the present invention.

FIG. 4 shows a HEMT to which the inventive concept is applicable. This device has a source 11 and a drain 12 with ohmic contacts 13 and 14 respectively. Furthermore, it comprises a first doped layer 2 having a larger band gap than a second adjacent layer 3. Thus, the donors in the first layer 2 are ionized and a two-dimensional electron gas is created at the interface between the first and second layers. In this case, the second layer 3 is divided into two sub-layers, namely a first undoped sub-layer 15 and a buffer layer 16. The device also comprises a gate 17, which potential may be varied to control the conductivity of the channel at the heterojunction 1.

The invention is of course not in any way restricted to the preferred embodiments described above, but many possibilities to modifications thereof will be apparent to a man with ordinary skill in the art.

As already mentioned, the invention also applies to other devices than HEMTs. Accordingly, it also applies when the first layer having a larger band gap is doped with acceptors and the two dimensional channel at the interface between the two layers contains holes as charge carriers.

As mentioned above, it is possible to use one or a combination of Group 3B-nitrides in the first layer according to the formula:

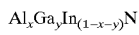
$Al_xGa_yIn_{(1-x-y)}N$ where $X+Y \leq 1$. The lattice match with SiC decreases in the direction AlN, GaN, and InN so that it will, in most cases, be preferred to have a part of the first layer of only AlN, at least close to the interface with the SiC semiconductor layer. However, it is readily possible to have a composition changing with the distance from the interface in an arbitrary way according to the wishes in every separate case.

All definitions concerning the materials of the different device layers do, of course, also include inevitable impurities as well as intentional doping of the two layers.

The definition layer is to be interpreted broadly and comprises all types of volume extensions and shapes.

The definition "other Group 3B-nitrides" in the claim is also to be interpreted as comprising the case of one single Group 3B-nitride, for instance GaN.

The SiC layer 3 may be of any polytype of SiC, such as for example 6H, 4H, 3C and 15R.

We claim:

1. A semiconductor device comprising two adjacent semiconductor layers of different materials forming a heterojunction therebetween, a first of said layers having a larger gap between the conduction band and the valence band than a second layer, and being doped with impurities providing charge for forming a high mobility surface channel in the second layer at the interface between said first and second layers, wherein the second layer is made of SiC and the first layer is made of one of a) AlN and b) an alloy of AlN and at least one other Group 3B-nitride, wherein said first layer includes a first region closest to said junction made of AlN, and wherein said first layer includes a second region adjacent to said first AlN region and separated from said junction thereby, said second region is made of an alloy of AlN and at least one other Group 3B-nitride.

2. A device according to claim 1, wherein a region of said first layer closest to said junction is not doped with said impurities.

3. A device according to claim 1, wherein said alloy has a content of GaN.

4. A device according to claim 3, wherein said alloy is an alloy of AlN and GaN.

5. A device according to claim 1, wherein said alloy has a content of InN.

6. A device according to claim 5, wherein said alloy is an alloy of AlN and InN.

7. A semiconductor device according to claim 5, wherein the concentration of InN in said alloy is less than 20%.

8. A device according to claim 1, wherein said second layer is made of 3B-SiC.

9. A device according to claim 1, wherein said first layer is N-doped.

10. A device according to claim 1, wherein said device is a high power device.

11. A device according to claim 1, wherein said device operates under high frequencies.

12. A device according to claim 1, wherein said device is a High Electron Mobility Transistor (HEMT).

13. A semiconductor device comprising two adjacent semiconductor layers of different materials forming a heterojunction therebetween, a first of said layers having a larger gap between the conduction band and the valence band than a second of said layers, and being doped with impurities providing charge for forming a high mobility surface channel in the second layer at the interface between said first layer and said second layer, wherein the second layer is made of SiC and the first layer is made of AlN and includes at least one region of an alloy of AlN and at least one other Group 3B-nitride.

14. A device according to claim 13, wherein the concentration of said at least one other Group 3B-nitride in said alloy in said at least one region of said first layer gradually increases in said at least one region in the direction away from said junction.

15. A device according to claim 14, wherein said region of gradually increasing concentration of said at least one other Group 3B-nitride is separated from said junction by a region of AlN.

* * * * *